United States Patent [19]

Shimizu et al.

[11] Patent Number: 5,329,171
[45] Date of Patent: Jul. 12, 1994

[54] ZERO CROSS DETECTION CIRCUIT

[75] Inventors: Yoshihiro Shimizu; Kazuo Hayashi, both of Hyogo, Japan

[73] Assignee: Mitsubishi Denki Kabushiki Kaisha, Tokyo, Japan

[21] Appl. No.: 902,132

[22] Filed: Jun. 22, 1992

[30] Foreign Application Priority Data

Jun. 25, 1991 [JP] Japan .................................. 3-180327

[51] Int. Cl.$^5$ .......................................... H03K 5/153
[52] U.S. Cl. ..................................... 307/354; 307/362
[58] Field of Search ................. 307/354, 355, 362, 475

[56] References Cited

U.S. PATENT DOCUMENTS 4,672,238 6/1987 Nemoto .............................. 307/354
5,077,489 12/1991 Gola et al. ......................... 307/362

FOREIGN PATENT DOCUMENTS 0122225 7/1984 Japan .................................. 307/354

OTHER PUBLICATIONS

Transistor Technology No. 5, pp. 119, 120, Dec. 1990.
Analog MOS Integrated Circuit, pp. 28–35 Mar. 1990.

Primary Examiner—John Zazworsky
Attorney, Agent, or Firm—Townsend and Townsend Khourie and Crew

[57] ABSTRACT

Zero cross detection accuracy is improved by providing one input side of a differential amplification circuit with a first voltage shift means for shifting the voltage of a signal to be detected up to the residual voltage value of the differential amplification circuit or more and the other input side of the circuit with a second voltage shift means having the same characteristic as the first voltage shift means and whose input terminal voltage is fixed to zero volt.

1 Claim, 4 Drawing Sheets

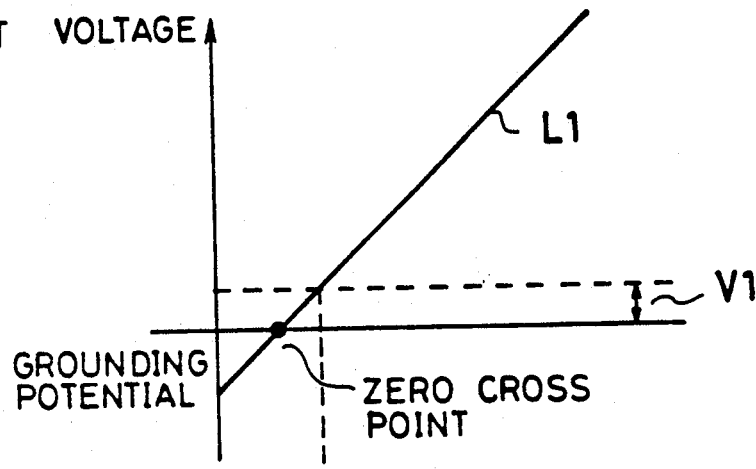
FIG. 4 (a) PRIOR ART
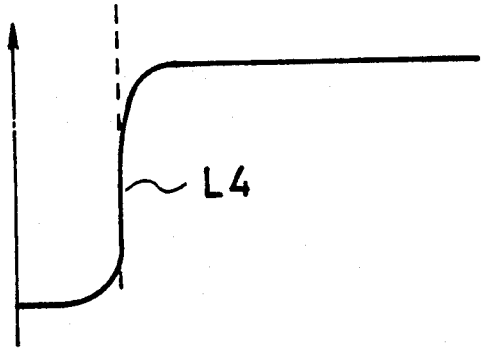
FIG. 4 (b) PRIOR ART

ZERO CROSS DETECTION CIRCUIT

BACKGROUND OF THE INVENTION

1. Field of the Invention

The present invention relates to a zero cross detection circuit to be mounted on a semiconductor integrated circuit of a one-chip microcomputer and operated by a single power source.

2. Description of the Prior Art

FIG. 3 is an equivalent circuit diagram of a zero cross detection circuit to be operated by a single power source and using a P-channel transistor differential amplification circuit according to the prior art. In FIG. 3, numeral 1 is an input terminal, 2 is an output terminal, and 3 is a power source which is a 5-V single power source generally used for microcomputers. Numeral 4 is a grounded circuit; 5 is a P-channel transistor whose source is connected to the power source 3 and whose drain and gate are connected each other; 6 is an N-channel transistor whose gate is connected to the power source 3, whose source is connected to the ground 4, and whose drain is connected to the drain of the P-channel transistor 5; 7 is a P-channel transistor whose source is connected to the power source 3 and whose gate is connected to the gate of the P-channel transistor 5; 8 is an N-channel transistor whose source is connected to the ground 4 and whose drain and gate are connected each other; 9 is an N-channel transistor whose source is connected to the ground 4 and whose gate is connected to the gate of the N-channel transistor 8; 10 is a P-channel transistor whose one end is connected to the drain of the P-channel transistor 7, whose other end is connected to the drain of the N-channel transistor 8, and whose gate in connected to the ground 4; 11 is a P-channel transistor whose one end is connected to the drain of the N-channel transistor 9, whose other end is connected to the drain of the P-channel transistor 7, and whose gate is connected to the input terminal 1; 12 is a P-channel transistor whose source is connected to the power source 3, whose drain is connected to the output terminal 2, and whose gate is connected to the gate of the P-channel transistor 5; 13 is an N-channel transistor whose source is connected to the grounded circuit 4, whose drain is connected to the drain of the P-channel transistor 12, and whose gate is connected to the drain of the N-channel transistor 9; and 14 is a CMOS differential amplification circuit comprising the P-channel transistors 7, 10, and 11, and the N-channel transistors 8 and 9.

The following is the description of operations of the circuit. The potential of the point A becomes a function of threshold potential of the P-channel transistor 5 and N-channel transistor 6 and is kept constant because the gate and drain of the P-channel transistor 5 are connected each other.

The P-channel transistor 7 serves as a constant current source because the gate potential is fixed to the potential of the point A. Resultingly, the potential of the point B is kept approximately constant.

The N-channel transistors 8 and 9 constitute a current mirror circuit, which operate so that the current of the P-channel transistor 10 will be equal to that of the P-channel transistor 11 and increase the voltage gain at this stage.

The above circuit constitution causes two actions to work on the point C in accordance with the potential change of the input terminal 1. When the potential of the input terminal 1 exceeds the potential (zero volt which is hereafter referred to as ground potential) of the ground 4, the potential difference between both ends of the P-channel transistor 11 increases as the first action to decrease the potential of the point C. As the second action, the potential of the point D increases by the value equivalent to the potential change of the point C but the N-channel transistor 8 decreases the potential of the point D. The N-channel transistors 8 and 9 are designed so that they have the same characteristic and the gate terminals of the them are connected each other. Therefore, the N-channel transistor 9 decreases the potential of the point C by the potential value of the point D decreased by the N-channel transistor 8. Thus, these two actions decrease the potential of the point C and increase the potential of the output terminal 2 through the N-channel transistor 13.

However, when the potential of the input terminal 1 decreases below the ground potential, the potential of the input terminal 2 is decreased due to actions opposite to the above actions.

Thus, it is possible to compare the potential of the input terminal 1 with the ground potential and detect the zero cross.

FIG. 4(a) shows the potential change of an input signal in the embodiment of the prior art and FIG. 4(b) shows the potential change of an output signal in the embodiment of the prior art. In FIGS. 4(a) and 4(b), L1 is an input signal, L4 is an output signal, and V1 is residual voltage.

The differential amplification circuit 14 has a residual voltage of 1 V, for example, in its circuitry, and cannot amplify a signal having a voltage less than 1 V. Therefore, the differential amplification circuit 14 cannot amplify a signal having a voltage less than 1 V when the residual voltage thereof is 1 V as shown in FIG. 4(a). Therefore, voltage equal to or lower than the residual voltage V1 cannot be amplified. Therefore, as shown in FIGS. 4(a) and 4(b), the differential amplification circuit 14 outputs the minimum output voltage when the level of the input signal L1 is equal to or lower than the residual voltage V1. When the level of the input signal L1 exceeds the residual voltage V1, the differential amplification circuit 14 recognizes that the level of the input signal L1 exceeds the ground voltage and suddenly raises the output potential.

Problem to Be Solved by the Invention

Because a one-chip microcomputer is normally operated by a single power source, it is preferable to operate it by a single power source when a zero cross detection circuit is mounted. To detect the difference between AC signal level and zero volt potential with a differential amplification circuit operated by a single power source, however, the detection accuracy is limited because residual voltage is present.

SUMMARY OF THE INVENTION

The present invention is made to solve the above problem and its objects is to provide a zero cross detection circuit capable of accurately detecting a zero cross point and operating by a single power source.

Means for Solving the Problem

The zero cross detection circuit of the present invention uses a differential amplification circuit to be operated by a single power source and detects a zero cross point of AC signals, in which one input side of the differential amplification circuit is provided with a first voltage shift means for shifting the voltage of a signal to be detected up to the residual voltage value of the differential amplification circuit or more and the other input side of it is provided with a second voltage shift means having the same shift characteristic as the first voltage shift means and whose input terminal voltage is fixed to zero volt.

The differential amplification circuit to be operated by a single power source comprises a CMOS differential amplification circuit and the first and second voltage shift means comprise first and second source follower circuits having the same characteristic.

Function

When an AC signal to be detected is inputted to the zero cross detection circuit of the present invention, the input signal is inputted to a first voltage shift means and shifted up to the residual voltage value of a differential amplification circuit or more before it is inputted to the differential amplification circuit while the output of a second voltage shift means having the same shift characteristic as the first voltage shift means and whose input terminal is grounded is inputted to the differential amplification circuit as its second input signal. The differential amplification circuit amplifies the potential difference between the two input signals and outputs it as a zero cross detection signal. As described above, by equally voltage-shifting the two input signals of the differential amplification circuit up to the residual voltage value or more through the voltage shift means, it is possible to avoid the influence of characteristic degradation around zero volt caused by the fact that the differential amplification circuit uses a single power source and realize accurate zero cross detection.

Moreover, when the differential amplification circuit to be operated by a single power source uses a CMOS differential amplification circuit and the first and second voltage shift means use first and second source follower circuits having the same characteristic, a preferable zero cross detection circuit can be obtained by mounting the above circuits on a semiconductor integrated circuit of a one-chip microcomputer.

The above and other objects, features, and advantages of the invention will become more apparent from the following description when taken in conjunction with the accompanying drawings.

BRIEF DESCRIPTION OF THE DRAWINGS

FIGS. 4(a) and 4(b) illustrate potential change of input and output signals of the embodiment according to the prior art.

DESCRIPTION OF THE PREFERRED EMBODIMENT

Embodiment

The following is the description of an embodiment of the present invention.

Figure 1:
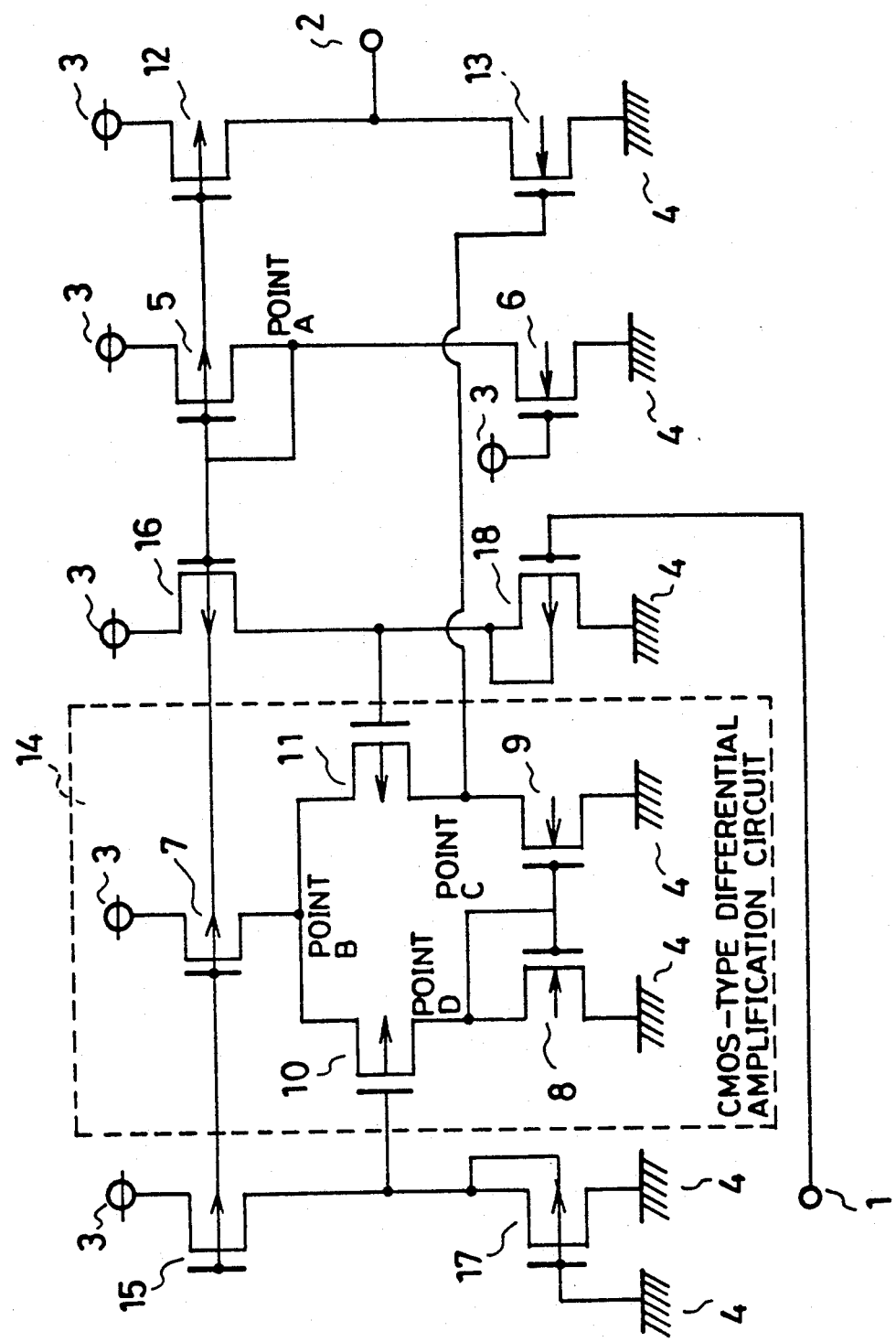
FIG. 1 shows an equivalent circuit diagram of a zero cross detection circuit to be operated by a single power source and using a P-channel transistor differential amplification circuit as an embodiment of the present invention.

FIG. 1 shows an equivalent circuit diagram of a zero cross detection circuit to be operated by a single power source and using a P-channel transistor differential amplification circuit as an embodiment of the present invention. In FIG. 1, numeral 1 is an input terminal, 2 is an output terminal, and 3 is a power source which is a 5-V single power source generally used for microcomputers. Numeral 4 is a grounded circuit; 5 is a P-channel transistor whose source is connected to the power source 3 and whose drain and gate are connected each other; 6 is an N-channel transistor whose gate is connected to the power source 3, whose source is connected to the ground 4, and whose drain is connected to the drain of the P-channel transistor 5; 7 is a P-channel transistor whose source is connected to the power source 3 and whose gate is connected to the gate of the P-channel transistor 5; 8 is an N-channel transistor whose source is connected to the ground 4 and whose drain and gate are connected each other; 9 is an N-channel transistor whose source is connected to the ground 4 and whose gate is connected to the gate of the N-channel transistor 8; 10 is a P-channel transistor whose one end is connected to the drain of the P-channel transistor 7 and whose other end is connected to the drain of the N-channel transistor 8; 11 is a P-channel transistor whose one end is connected to the drain of the N-channel transistor 9 and whose other end is connected to the drain of the P-channel transistor 7; 12 is a P-channel transistor whose source is connected to the power source 3, whose drain is connected to the output terminal 2, and whose gate is connected to the gate of the P-channel transistor 5; 13 is an N-channel transistor whose source is connected to the ground 4, whose drain is connected to the drain of the P-channel transistor 12, and whose gate is connected to the drain of the N-channel transistor 9; 14 is a CMOS differential amplification circuit comprising the P-channel transistors 7, 10, and 11, and the N-channel transistors 8 and 9; 15 and 16 are P-channel transistor s whose sources are connected to the power source 3 and whose gates are connected to the gate of the P-channel transistor 5; 17 is a P-channel transistor whose gate and drain are connected to the grounded circuit 4 and whose source is connected to the gate of the P-channel transistor 10; and 18 is a P-channel transistor whose drain is connected to the ground 4 and whose source is connected to the gate of the P-channel transistor 11. In this case, the P-channel transistor 18 corresponds to the first voltage shift means of the present invention as a first source follower circuit and the P-channel transistor 17 corresponds to the second voltage shift means of the present invention as a second source follower circuit.

The following is the description of operations of the circuit. The potential of the point A becomes a function of threshold potential of the P-channel transistor 5 and N-channel transistor 6 and is kept constant because the gate and drain of the P-channel transistor 5 are connected each other.

The P-channel transistor 7 serves as a constant current source because the gate potential is fixed to the potential of the point A. Resultingly, the potential of the point B is kept approximately constant.

The N-channel transistors 8 and 9 constitute a current mirror circuit, which operate so that the current of the P-channel transistor 10 will be equal to that of the P-channel transistor 11 and increase the voltage gain at this stage.

The P-channel transistors 17 and 18 are source follower circuits having the same characteristic. Because the source potential of the circuits has the same AC component as the gate potential and the DC component has a potential which is higher by the voltage applied between the gate and source, the circuits are set as voltage shift means so that they are shifted up to the residual voltage value of the differential amplification circuit 14 or more. Therefore, by inputting a signal to be detected and ground potential to the differential amplification circuit 14 through these source follower circuits, it is possible to add an offset voltage equal to or higher than the residual voltage to the signal to be detected and ground potential and shift a zero cross point upward by the predetermined value.

The above circuit constitution causes two actions to work on the point C in accordance with the potential change of the input terminal 1. When the potential of the input terminal 1 exceeds the ground potential, the potential difference between both ends of the P-channel transistor 11 increases as the first action to decrease the potential of the point C. As the second action, the potential of a point D increases by the value equivalent to the potential change of the point C but the N-channel transistor 8 decreases the potential of the point D. The N-channel transistors 8 and 9 are designed so that they have the same characteristic and the gate terminals of the them are connected each other. Therefore, the N-channel transistor 9 decreases the potential of the point C by the potential value of the point D decreased by the N-channel transistor 8. Thus, these two actions decrease the potential of the point C and increase the potential of the output terminal 2 through the N-channel transistor 13.

However, when the potential of the input terminal 1 decreases below the ground potential, the potential of the output terminal 2 is decreased due to actions opposite to the above actions.

Figure 2A:
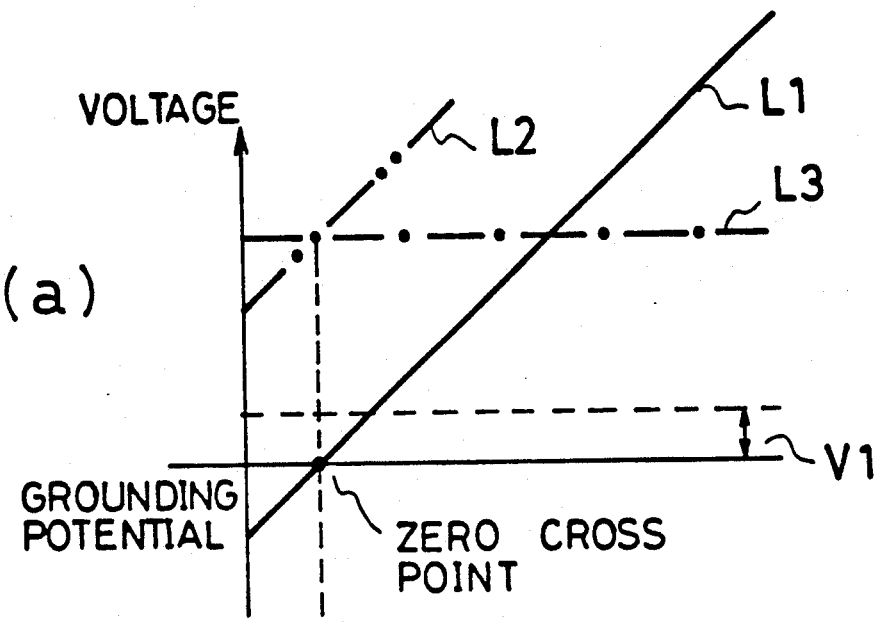
FIGS. 2(a) and 2(b) illustrate potential change of input and output signals of the embodiment.
Figure 2B:
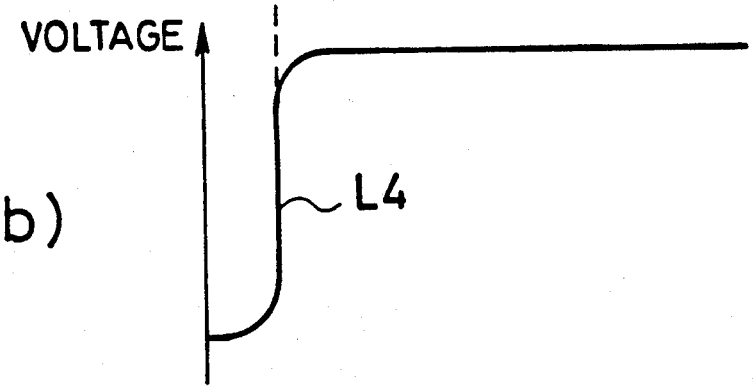
Figure 3:
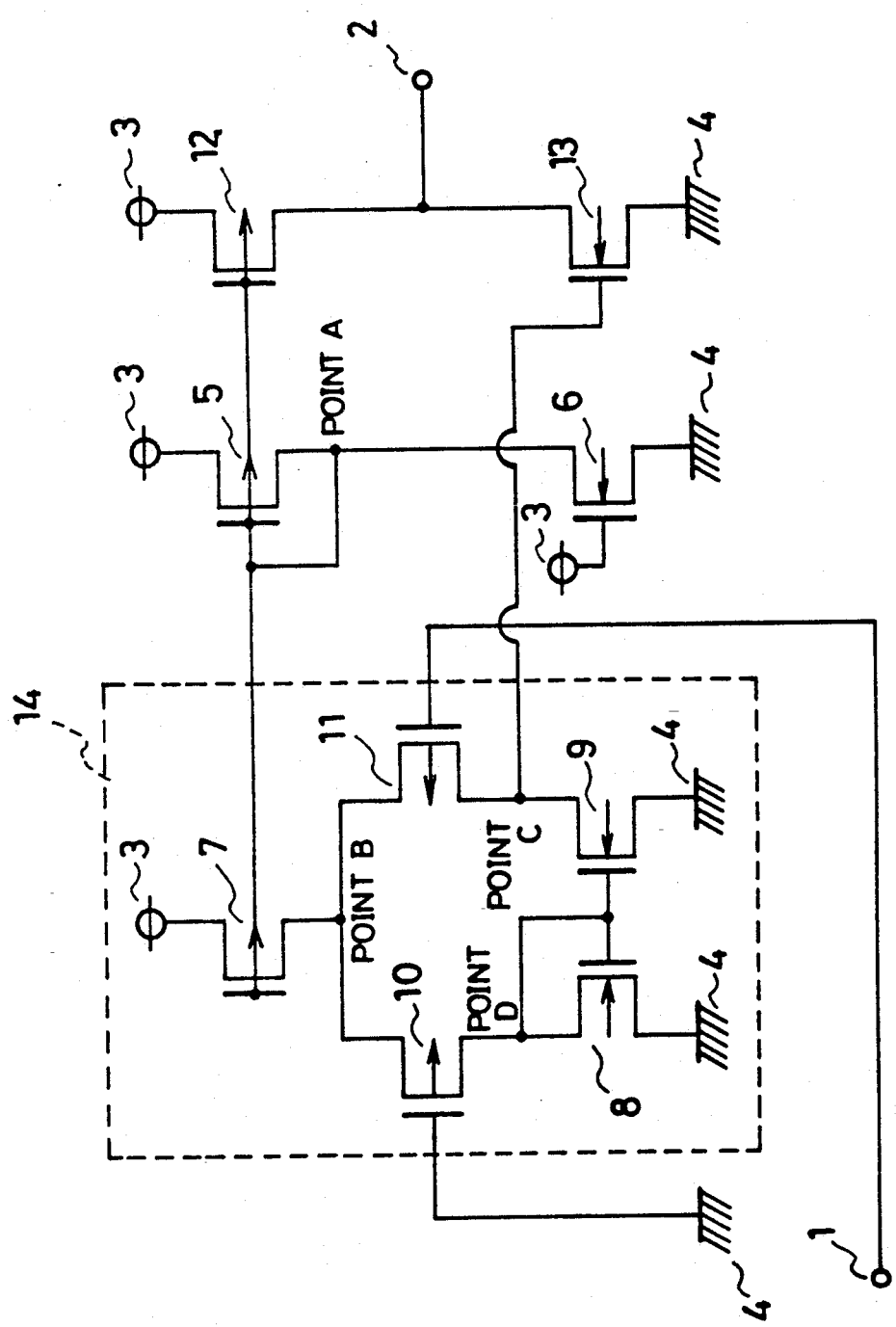
FIG. 3 shows an equivalent circuit diagram of a zero cross detection circuit to be operated by a single power source and using a P-channel transistor differential amplification circuit according to the prior art.

FIG. 2(a) shows the potential change of an input signal in the above embodiment and FIG. 2 (b) shows the potential change of an output signal in the above embodiment. In FIGS. 2(a) and 2(b), L1 is an input signal, L2 is the gate potential of the P-channel transistor 11, L3 is the gate potential of the P-channel transistor 10, L4 is an output signal, and V1 is residual voltage.

The above embodiment makes it possible to potential-shift the ground potential and input signal L1 upward by inputting the ground potential (zero volt) and input signal L1 to the differential amplification circuit 14 through the P-channel transistors 17 and 18 respectively. That is, as shown in FIGS. 2(a) and 2(b), the intersection between the potential L3 generated by shifting the ground potential and the potential L2 generated by shifting the input signal L1 is shifted to a potential higher than the residual voltage V1. Therefore, the differential amplification circuit 14 outputs the minimum output voltage while the level of the input signal L1 is equal to or lower than the ground potential and outputs the maximum output voltage when the level of the input signal L1 exceeds the ground potential. Thus, accurate zero cross detection can be performed.

As described above, the zero cross detection circuit of this embodiment has the first source follower circuit 18 for shifting the voltage of a signal to be detected up to the residual voltage value or more of the differential amplification circuit to be operated by a single power source, the second source follower circuit 17 having the same characteristic as the first source follower circuit and whose input terminal voltage is fixed to zero volt, and the CMOS differential amplification circuit 14 to be operated by a single power source and for amplifying the potential difference between the output of the first source follower circuit 18 and that of the second source follower circuit 17.

When an AC signal is inputted to the zero cross detection circuit as a signal to be detected, the input signal is inputted to the first source follower circuit 18 and shifted in the positive direction up to the residual voltage value or more before it is inputted to the CMOS differential amplification circuit 14, while the output of the second source follower circuit 17 having the same characteristic as the first source follower circuit 18 and whose input terminal is grounded is inputted to the CMOS differential amplification circuit 14 as its second input signal. The CMOS differential amplification circuit 14 amplifies the potential difference between the two input signals and outputs it as a zero cross detection signal. As described above, by voltage-shifting the two input signals of the CMOS differential amplification circuit 14 in the positive direction through the source follower circuits 17 and 18 respectively, it is possible to avoid the influence of characteristic degradation around zero volt caused by the fact that the CMOS differential amplification circuit 14 uses a single power source and realize accurate zero cross detection. Therefore, a preferable zero cross detection circuit can be obtained by mounting the circuit on a semiconductor integrated circuit to be operated by a single power source of a one-chip microcomputer.

Advantage of the Invention

As described above, the present invention realizes accurate zero cross detection by using a differential amplification circuit to be operated by a single power source because one input side of the differential amplification circuit to be operated by a single power source is provided with a first voltage shift means for shifting the voltage of a signal to be detected up to the residual voltage value of the differential amplification circuit or more and the other side of the circuit is provided with a second voltage shift means having the same characteristic as the first voltage shift means and whose input terminal voltage is fixed to zero volt.

Moreover, because the differential amplification circuit to be operated by a single power source uses a CMOS differential amplification circuit and the first and second voltage shift means use first and second source follower circuits having the same characteristic, a preferable zero cross detection circuit can be obtained by mounting the circuits on a semiconductor integrated circuit of a one-chip microcomputer.

What is claimed is:

1. A zero cross detection circuit for detecting zero cross-over points of AC input signals comprising:
   a first CMOS circuit for providing a constant gate voltage;
   a CMOS differential amplification circuit operated by a single power source, said amplification circuit including first and second differential signal inputs responsive to the input signals exceeding a first residual voltage;

first CMOS voltage shift means including a first current source transistor having a first terminal coupled to a first terminal of said power source, a second terminal coupled to a first node, and a gate coupled to receive said constant gate voltage and a first source follower transistor circuit having a first terminal coupled to said first node, a second terminal coupled to a ground terminal of the single power source, and a gate coupled to receive said AC signals having said zero cross-over points and with said first node coupled to the first differential input of said differential amplifier circuit, said first CMOS voltage shift mean shifting the voltage of said zero cross-over points to be detected to be greater than or equal to the residual voltage value of said differential amplification circuit; and second voltage shift means including a second current source transistor having a first terminal coupled to the first terminal of said power source, a second terminal coupled to a second node, and a gate coupled to receive said constant gate voltage and a second source follower transistor circuit having a first terminal coupled to said second node, a second terminal coupled to said ground terminal of the single power source, and a gate coupled to said ground terminal of the single power source, said second voltage shift means shifting the voltage level at said ground terminal of said single power source by a level equal to the shift of said zero cross-over points of the input AC signals and with said second node coupled to the second differential input of said differential amplifier circuit.

* * * * *